(12) United States Patent
Hsiao et al.

(10) Patent No.: US 9,406,771 B1
(45) Date of Patent: Aug. 2, 2016

(54) SEMICONDUCTOR STRUCTURE AND MANUFACTURING METHOD THEREOF

(71) Applicant: UNITED MICROELECTRONICS CORP., Hsinchu (TW)

(72) Inventors: Shih-Yin Hsiao, Chiayi County (TW); Hsueh-Chun Hsiao, Hsinchu County (TW); Tzu-Yun Chang, Hsinchu County (TW); Ching-Chung Yang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/854,161

(22) Filed: Sep. 15, 2015

(51) Int. Cl.
| | |
|---|---|
| *H01L 29/78* | (2006.01) |
| *H01L 29/49* | (2006.01) |
| *H01L 29/423* | (2006.01) |
| *H01L 29/08* | (2006.01) |
| *H01L 29/06* | (2006.01) |
| *H01L 21/28* | (2006.01) |
| *H01L 21/265* | (2006.01) |

(52) U.S. Cl.
CPC .......... *H01L 29/4983* (2013.01); *H01L 21/265* (2013.01); *H01L 21/28105* (2013.01); *H01L 29/0653* (2013.01); *H01L 29/0847* (2013.01); *H01L 29/42368* (2013.01); *H01L 29/42372* (2013.01)

(58) Field of Classification Search
CPC .................................................. H01L 29/1041
See application file for complete search history.

(56) References Cited

U.S. PATENT DOCUMENTS

| | | | | | |
|---|---|---|---|---|---|
| 6,232,642 | B1* | 5/2001 | Yamazaki | ....... | H01L 21/823807 257/327 |
| 6,498,085 | B2* | 12/2002 | Jung | ....... | H01L 29/49 257/E21.206 |
| 6,847,065 | B1* | 1/2005 | Lum | ....... | H01L 21/823807 257/219 |
| 7,244,975 | B2* | 7/2007 | Chen | ....... | H01L 29/0638 257/202 |
| 2009/0294848 | A1* | 12/2009 | Chang | ....... | H01L 21/28105 257/335 |
| 2010/0213545 | A1* | 8/2010 | Kho | ....... | H01L 29/0692 257/339 |
| 2010/0320529 | A1* | 12/2010 | Dong | ....... | H01L 21/76224 257/327 |

* cited by examiner

*Primary Examiner* — Michael Lebentritt
*Assistant Examiner* — Jordan Klein
(74) *Attorney, Agent, or Firm* — WPAT, PC; Justin King

(57) ABSTRACT

A semiconductor structure and a manufacturing method thereof are provided. The semiconductor structure includes a substrate; a first and a second ion implantation regions of a first conductive type; a source and a drain diffusion regions formed in the first and the second ion implantation regions respectively; a channel diffusion region formed between the first and the second ion implantation regions; a gate layer disposed above the channel diffusion region and located between the source and the drain diffusion regions; and a third ion implantation region of a second conductive type formed in the gate layer, which extends in a first direction. The third ion implantation region is located above and covers two side portions of the channel diffusion region, the two side portions are adjacent to two edges, extending in a second direction perpendicular to the first direction, of the channel diffusion region.

12 Claims, 6 Drawing Sheets

SEMICONDUCTOR STRUCTURE AND MANUFACTURING METHOD THEREOF

BACKGROUND

1. Technical Field

The disclosure relates in general to a semiconductor structure and a manufacturing method thereof, and more particularly to a semiconductor structure that can minimize kirk effect and a manufacturing method thereof.

2. Description of the Related Art

High-voltage metal oxide semiconductor (HVMOS) devices have been widely applied in a variety of semiconductor components. Due to the trends of the reduction of sizes of semiconductor components, the size of the channel diffusion region in a HVMOS device is reduced as well. The size reduction of the channel diffusion region results in a narrower channel width, which raises new issues to the devices, such as current leakage, kirk effect, and etc. These issues may cause the HVMOS device fail or malfunction.

SUMMARY OF THE INVENTION

The disclosure is directed to a semiconductor structure and a manufacturing method thereof. According to the embodiments of the present disclosure, in the semiconductor structure, two side portions of the channel diffusion region are covered by the third ion implantation region formed within the gate layer, such that current would pass through the center region having lower threshold voltage rather than the corner regions having higher threshold voltage, and thus kirk effect can be minimized, and possible damages to the device can be further prevented.

According to an embodiment of the present disclosure, a semiconductor structure is disclosed. The semiconductor structure includes a substrate, a first ion implantation region of a first conductivity type, a second ion implantation region of the first conductivity type, a source diffusion region, a drain diffusion region, a channel diffusion region, a gate layer, and a third ion implantation region of a second conductivity type. The first ion implantation region and the second ion implantation region are formed in the substrate. The source diffusion region and the drain diffusion region are formed in the first ion implantation region and the second ion implantation region respectively. The channel diffusion region is formed in the substrate and located between the first ion implantation region and the second ion implantation region. The gate layer is disposed above the channel diffusion region and located between the source diffusion region and the drain diffusion region, and the gate layer extends in a first direction. The third ion implantation region is formed in the gate layer. The third ion implantation region is located above and covers two side portions of the channel diffusion region, the two side portions are adjacent to two edges of the channel diffusion region, and the two edges extend in a second direction perpendicular to the first direction.

According to another embodiment of the present disclosure, a manufacturing method of a semiconductor structure is disclosed. The manufacturing method includes the following steps: providing a substrate; forming a first ion implantation region of a first conductivity type and a second ion implantation region of the first conductivity type in the substrate; forming a source diffusion region and a drain diffusion region in the first ion implantation region and the second ion implantation region respectively; forming a channel diffusion region in the substrate and located between the first ion implantation region and the second ion implantation region; forming a gate layer disposed above the channel diffusion region and located between the source diffusion region and the drain diffusion region, wherein the gate layer extends in a first direction; and forming a third ion implantation region of a second conductivity type in the gate layer, wherein the third ion implantation region is located above and covers two side portions of the channel diffusion region, the two side portions are adjacent to two edges of the channel diffusion region, and the two edges extend in a second direction perpendicular to the first direction.

The disclosure will become apparent from the following detailed description of the preferred but non-limiting embodiments. The following description is made with reference to the accompanying drawings.

DETAILED DESCRIPTION OF THE INVENTION

Figure 1A:
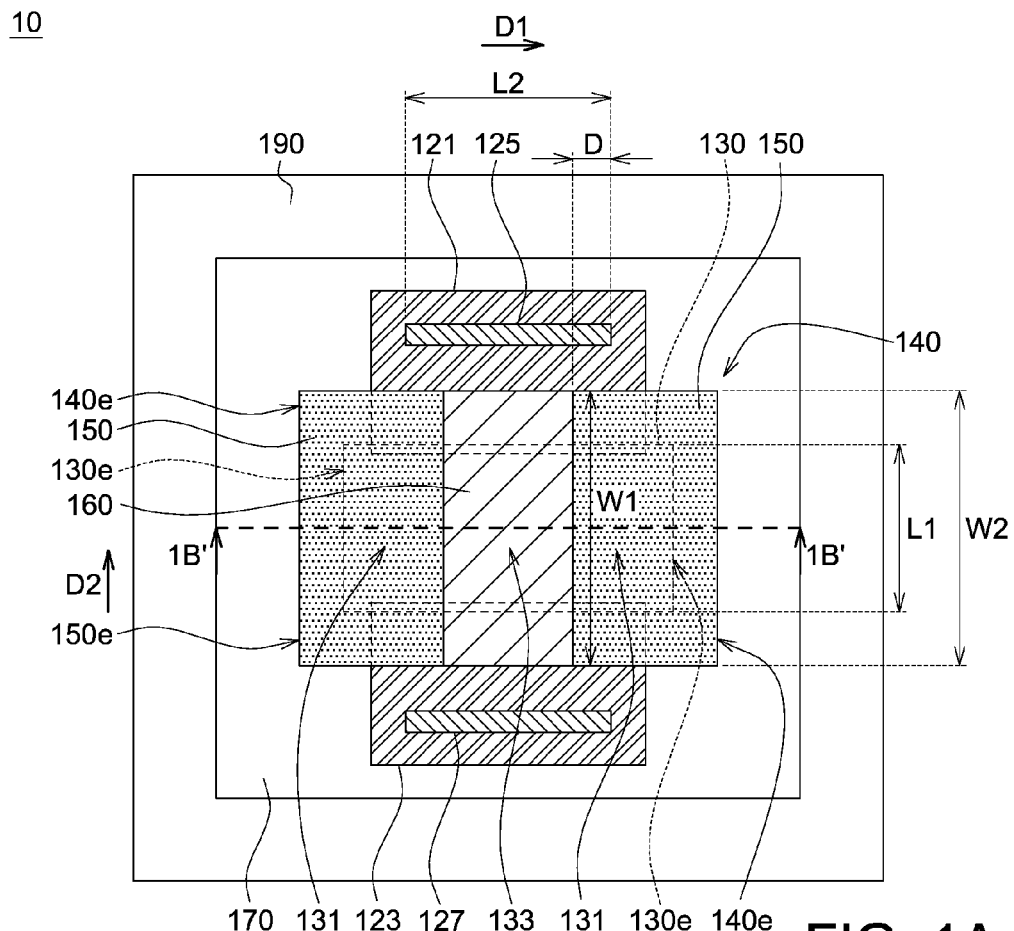
FIG. 1A is a top view of a semiconductor structure according to an embodiment of the present disclosure.

According to the embodiments of the present disclosure, in the semiconductor structure, two side portions of the channel diffusion region are covered by the third ion implantation region formed within the gate layer, such that current would pass through the center region having lower threshold voltage rather than the corner regions having higher threshold voltage, and thus kirk effect can be minimized, and possible damages to the device can be further prevented. The identical or similar elements of the embodiments are designated with the same reference numerals. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1B:
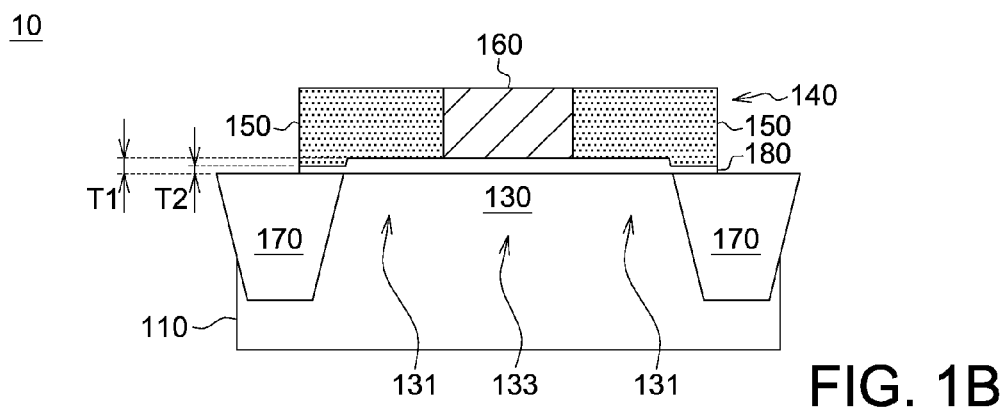
FIG. 1B is a cross-sectional view along the cross-section line 1B-1B' in FIG. 1A.

FIG. 1A is a top view of a semiconductor structure 10 according to an embodiment of the present disclosure, and FIG. 1B is a cross-sectional view along the cross-section line 1B-1B' in FIG. 1A. As shown in FIGS. 1A-1B, the semiconductor structure 10 includes a substrate 110, a first ion implantation region 121 of a first conductivity type, a second ion implantation region 123 of the first conductivity type, a source diffusion region 125, a drain diffusion region 127, a channel diffusion region 130, a gate layer 140, and a third ion implantation region 150 of a second conductivity type.

Please refer to FIGS. 1A-1B. The first ion implantation region 121 and the second ion implantation region 123 are formed in the substrate 110. The source diffusion region 125 and the drain diffusion region 127 are formed in the first ion implantation region 121 and the second ion implantation region 123, respectively. The channel diffusion region 130 is formed in the substrate 110 and located between the first ion implantation region 121 and the second ion implantation region 123. The gate layer 140 is disposed above the channel diffusion region 130 and located between the source diffusion region 125 and the drain diffusion region 127, and the gate layer 140 extends in a first direction D1. The third ion implantation region 150 is formed in the gate layer 140. The third ion implantation region 150 is located above two side portions 131 of the channel diffusion region 130, and the third ion implantation region 150 covers the two side portions 131 of the channel diffusion region 130. The two side portions 131 are adjacent to two edges 130e of the channel diffusion region 130, and the two edges 130e extend in a second direction D2 perpendicular to the first direction D1.

The first conductivity type is complimentary to the second conductivity type. In an embodiment, the first conductivity type is N type, and the second conductivity type is P type. In an alternative embodiment, the first conductivity type may be P type, and the second conductivity type may be N type. In the embodiments, the gate layer 140 may be formed of polysilicon.

In the embodiments of the present disclosure, the semiconductor structure may be applied in both an HV NMOS device and an HV PMOS device. For example, in an embodiment, the semiconductor structure 10 is applied in such as an HV NMOS device, and the third ion implantation region 150 is such as a P type doped region. As the two side portions 131 of the channel diffusion region 130 are covered by the P type third ion implantation region 150 formed within the gate layer 140, which may be formed of N-doped polysilicon, the device threshold voltage Vt at corner regions corresponding to the channel diffusion region 130 would be higher than that at the center region; as such, when applying a voltage, current would pass through the center region rather than the corner regions, which is advantageous to minimizing the kirk effect and preventing possible damages to the device.

In the embodiments, as shown in FIG. 1A, the two edges 130e of the channel diffusion region 130 have an edge length L1 along the second direction D2, and the edge length L1 is actually the channel length of the MOS device applying the semiconductor structure 10. In the embodiments, the semiconductor structure may be applied in a HV MOS device having a relatively narrow channel width, for example, a channel width of about 3 μm. In the embodiments, the edge length L1 (channel length) of the channel diffusion region 130 is about 2.5 μm.

It is to be noted that for HVMOS devices having reduced sizes, the channel width and/or the channel length thereof is reduced accordingly, such that the dopants (e.g. boron) may easily segregate to the interface between the channel diffusion region and an isolation structure, causing kirk effect. According to the embodiments of the present disclosure, two side portions 131 of the channel diffusion region 130 are covered by the third ion implantation region 150 formed within the gate layer 140; as such, current would pass through the center region having lower threshold voltage rather than the corner regions having higher threshold voltage, such that kirk effect can be further minimized, possible damages to the device applying the semiconductor structure can be further prevented, and a HVMOS device with a narrow channel width applying the semiconductor structure can be achieved.

In the embodiments, as shown in FIG. 1A, the channel diffusion region 130 may overlap the first ion implantation region 121 and the second ion implantation region 123.

In the embodiments, as shown in FIG. 1A, the third ion implantation region 150 may be located above and covers a portion of the first ion implantation region 121 and a portion of the second ion implantation region 123.

In the embodiments, as shown in FIG. 1A, the third ion implantation region 150 may extend along the first direction D1 towards a region between the source diffusion region 125 and the drain diffusion region 127; that is, a portion of the third ion implantation region 150 is located between the source diffusion region 125 and the drain diffusion region 127. In the embodiment, the third ion implantation region 150 may extend along the first direction D1 towards the region between the source diffusion region 125 and the drain diffusion region 127 by an extending distance D, the source diffusion region 125 has a source length L2, and a ratio of the extending distance D to the source length L2 is such as ⅙ to ⅓. For example, the source length L2 may be 3 μm, and the extending distance D may be 0.5-1.0 μm.

As shown in FIGS. 1A-1B, in the embodiments, the semiconductor structure 10 may further include a fourth ion implantation region 160 of the first conductivity type. The fourth ion implantation region 160 is formed in the gate layer 140, and the fourth ion implantation region 160 is located above and covers at least a center portion 133 of the channel diffusion region 130. In the embodiments, the gate layer 140 may include only the third ion implantation region 150 and the fourth ion implantation region 160 having complimentary conductivity types.

As shown in FIGS. 1A-1B, in the embodiments, the semiconductor structure 10 may further include an isolation structure 170 and a gate oxide 180. The isolation structure 170 is located adjacent to the edges 130e of the channel diffusion region 130. The gate oxide 180 is formed on the channel diffusion region 130 and the isolation structure 170. As shown in FIG. 1B, the thickness T1 of the gate oxide 180 above the channel diffusion region 130 is larger than the thickness T2 of the gate oxide 180 above the isolation structure 170. For example, the thickness T1 of the gate oxide 180 above the channel diffusion region 130 may be about 1000 Å, and the thickness T2 of the gate oxide 180 above the isolation structure 170 may be about 700 Å.

In the embodiments, the third ion implantation region 150 covers a portion of the gate oxide 180 above the isolation structure 170. In other words, the third ion implantation region 150 covers the portion of the gate oxide 180 having the smaller thickness T2. In an HVMOS device, the narrower the channel width is, the more seriously the device may be suffered from kirk effect. Such kirk effect is even more seriously due to the thinner gate oxide 180 located above the isolation structure 170. According to the embodiments of the present disclosure, the third ion implantation region 150 covers the portion of the gate oxide 180 having the smaller thickness T2, such that current would pass through the center region rather than the corner regions wherein the thinner gate oxide 180 (having the thickness T2) is located, which is further advantageous to minimizing the kirk effect and preventing possible damages to the device.

As shown in FIG. 1A, in the embodiments, the semiconductor structure 10 may further include an isolation ion implantation region 190 of the second conductive type. The isolation structure 170 is disposed between the channel diffusion region 130 and the isolation ion implantation region 190, and the third ion implantation region 150 is separated from the isolation ion implantation region 190. As shown in FIG. 1A, the third ion implantation region 150 is not in contact with the isolation ion implantation region 190, and the third ion implantation region 150 is spaced apart from the isolation ion implantation region 190 by a distance.

In the present embodiment, as shown in FIG. 1A, the third ion implantation region 150 has a first width W1 along the second direction D2, the gate layer 140 has a gate width W2 along the second direction D2, and the first width W1 of the third ion implantation region 150 is equal to the gate width W2.

Additionally, in the present embodiment, as shown in FIG. 1A, the third ion implantation region 150 extends along the first direction D1 and stops at two opposite edges 140e of the gate layer 140.

Figure 2:
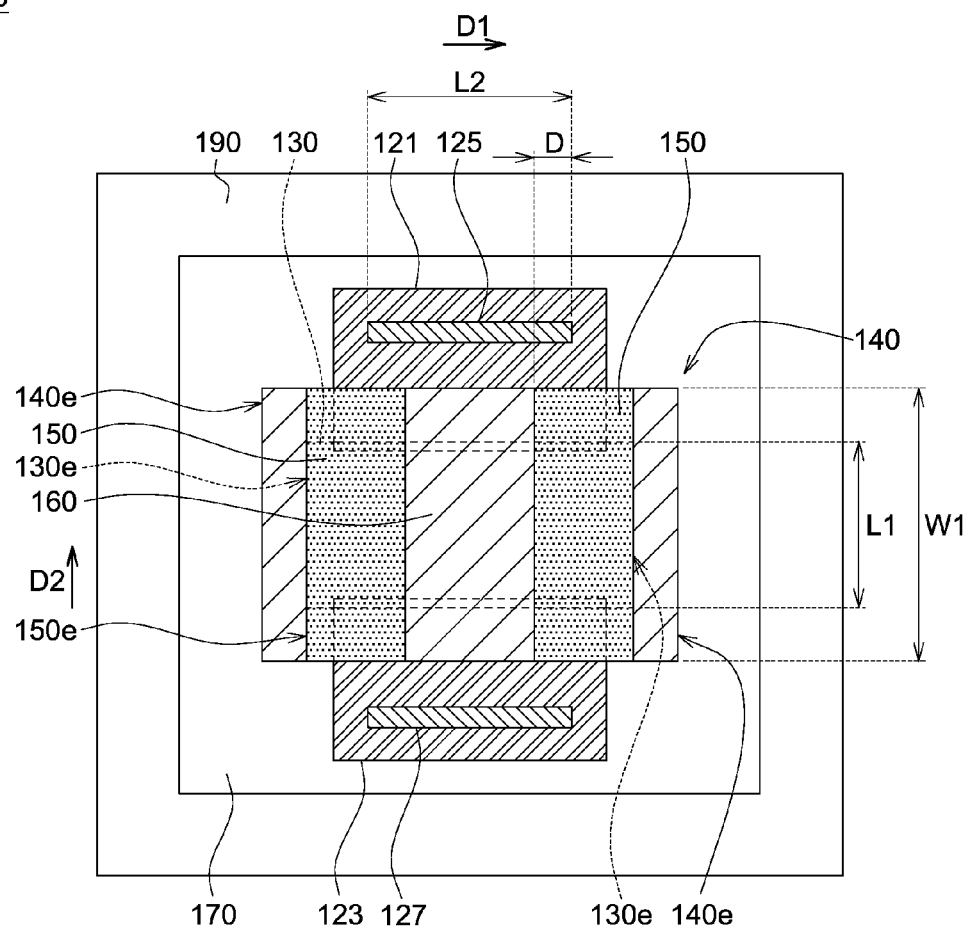
FIG. 2 is a top view of a semiconductor structure according to another embodiment of the present disclosure.

FIG. 2 is a top view of a semiconductor structure 20 according to another embodiment of the present disclosure. The elements in the present embodiment sharing similar or the same labels with those in the previous embodiment are similar or the same elements, and the description of which is omitted.

As shown in FIG. 2, in the present embodiment, the first width W1 of the third ion implantation region 150 along the second direction D2 is equal to the gate width W2 of the gate layer 140 along the second direction D2. In addition, as shown in FIG. 2, the third ion implantation region 150 extends along the first direction D1 and stops before reaching the edges 140e of the gate layer 140.

Particularly, in the present embodiment, the edges 150e of the third ion implantation region 150 is spaced apart from the edges 140e of the gate layer 140, and additionally, the edges 150e of the third ion implantation region 150 may stop at the edges 130e of the channel diffusion region 130.

As such, the third ion implantation region 150 covers the two side portions, which are adjacent to the two edges 130e, of the channel diffusion region 130.

Figure 3:
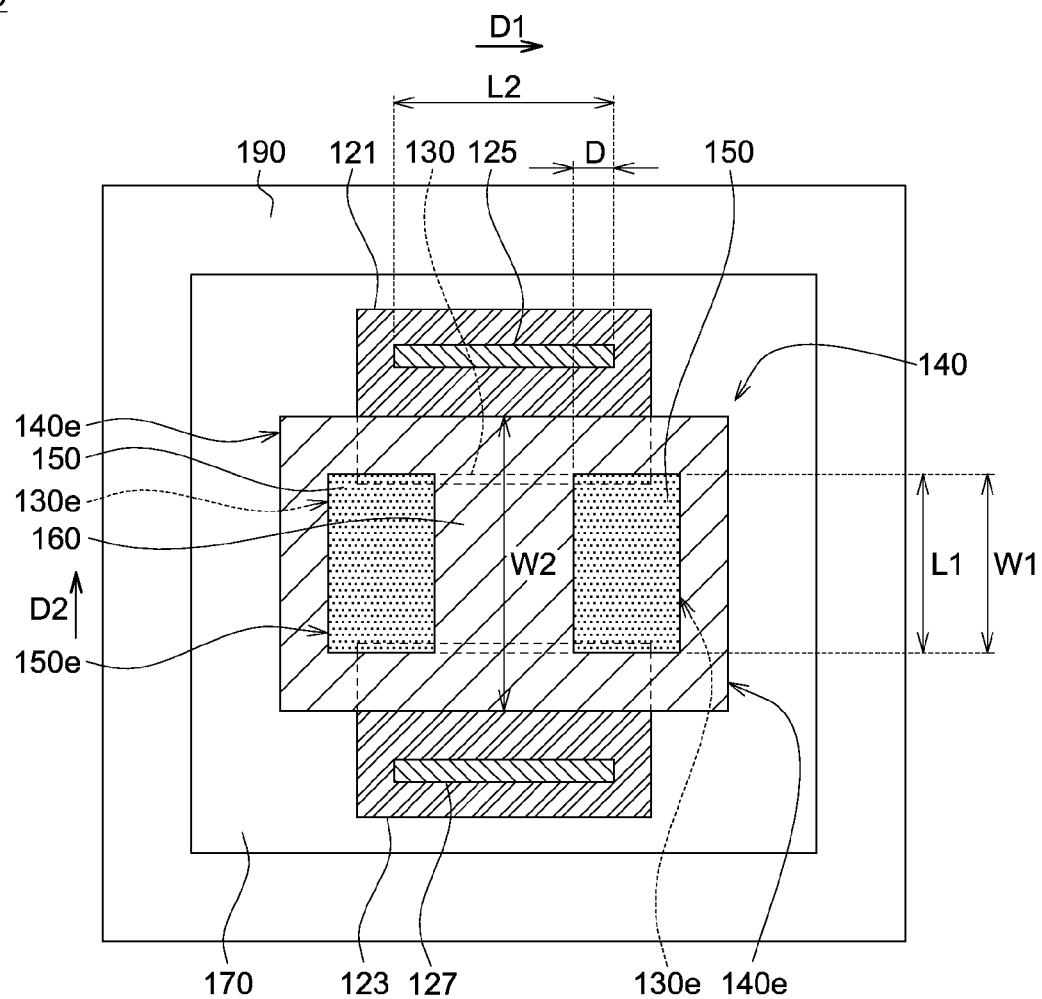
FIG. 3 is a top view of a semiconductor structure according to a further embodiment of the present disclosure.

FIG. 3 is a top view of a semiconductor structure 30 according to a further embodiment of the present disclosure. The elements in the present embodiment sharing similar or the same labels with those in the previous embodiment are similar or the same elements, and the description of which is omitted.

As shown in FIG. 3, in the present embodiment, the first width W1 of the third ion implantation region 150 is equal to the edge length L1 of the two edges 130e of the channel diffusion region 130.

Additionally, in the embodiment as shown in FIG. 3, the third ion implantation region 150 extends along the first direction D1 and stops at the two edges 130e of the channel diffusion region 130. As such, the third ion implantation region 150 covers the two side portions, which are adjacent to the two edges 130e, of the channel diffusion region 130.

Figure 4:
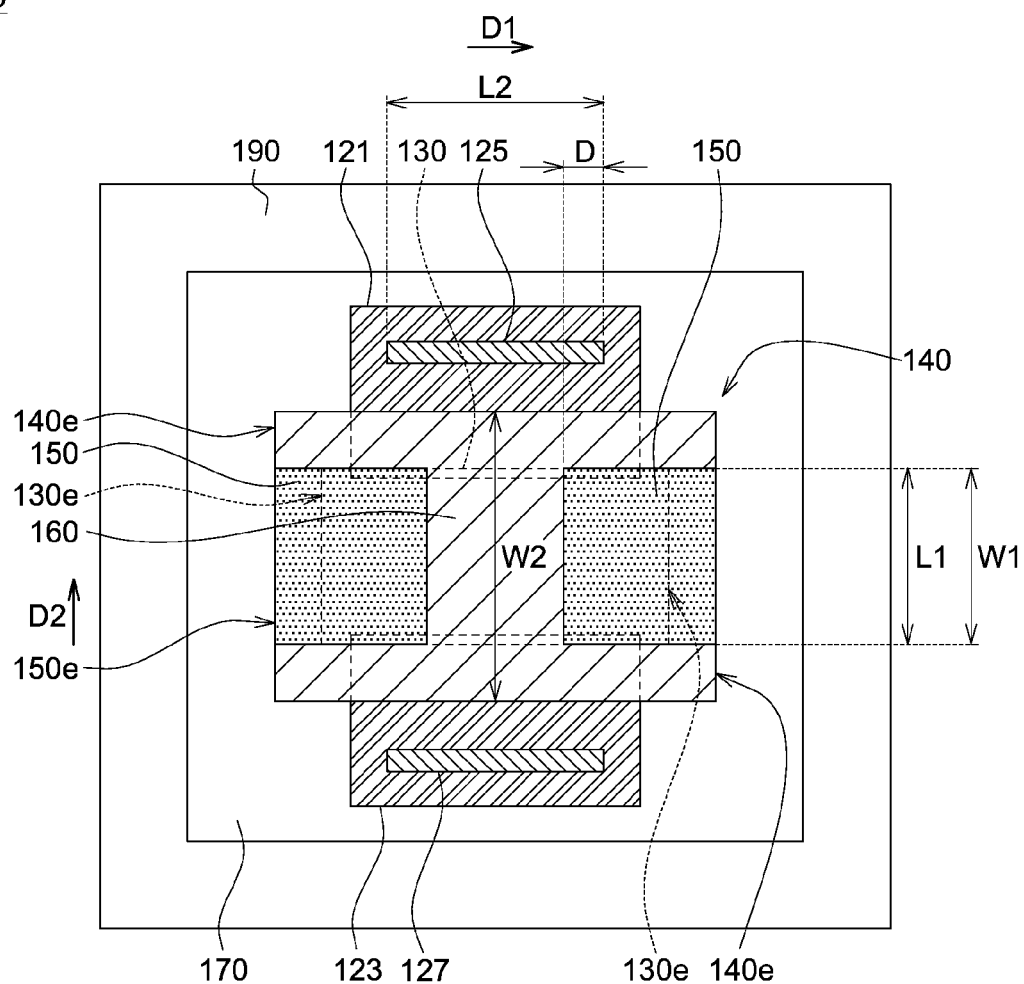
FIG. 4 is a top view of a semiconductor structure according to an additional embodiment of the present disclosure.

FIG. 4 is a top view of a semiconductor structure 40 according to an additional embodiment of the present disclosure. The elements in the present embodiment sharing similar or the same labels with those in the previous embodiment are similar or the same elements, and the description of which is omitted.

As shown in FIG. 4, in the present embodiment, the first width W1 of the third ion implantation region 150 is equal to the edge length L1 of the two edges 130e of the channel diffusion region 130.

Additionally, in the present embodiment, as shown in FIG. 4, the third ion implantation region 150 extends along the first direction D1 and stops at two opposite edges 140e of the gate layer 140. As such, the third ion implantation region 150 covers the two side portions, which are adjacent to the two edges 130e, of the channel diffusion region 130.

As described above in at least the embodiments of FIGS. 1-4, it is apparent to one having ordinary skill in the art that the extending range of the third ion implantation region 150 may vary according to actual needs as long as the two side portions 131 of the channel diffusion region 130 are covered by the third ion implantation region 150. Accordingly, due to the design flexibility of the covering range of the third ion implantation region 150, the device threshold voltage Vt at corner regions corresponding to the channel diffusion region 130 would be tunable by varying the extending range of the third ion implantation region 150, which is further advantageous to minimizing the kirk effect as well as preventing other undesired I-V characteristics from occurring.

Figure 5A:
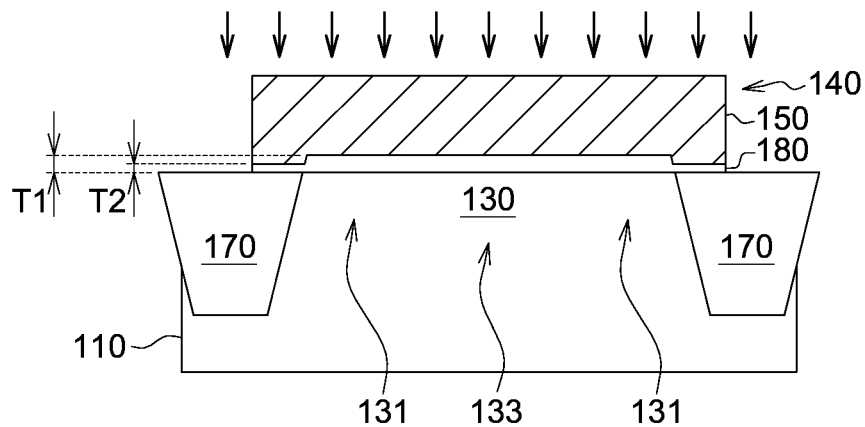
FIGS. 5A-5B illustrate a manufacturing method of a semiconductor structure according to an embodiment of the present disclosure.
Figure 5B:
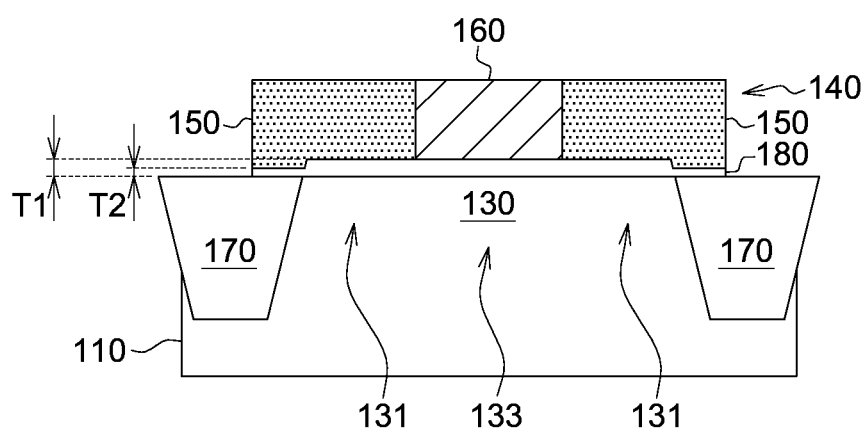

FIGS. 5A-5B illustrate a manufacturing method of a semiconductor structure according to an embodiment of the present disclosure. The elements in the present embodiment sharing similar or the same labels with those in the previous embodiment are similar or the same elements, and the description of which is omitted. Please refer to FIGS. 1A-1B and 5A-5B, a manufacturing method of a semiconductor structure 10 is provided in the following.

Referring to FIGS. 1A and 5A, a substrate 110 is provided. A first ion implantation region 121 of a first conductivity type and a second ion implantation region 123 of the first conductivity type are formed in the substrate 110. A source diffusion region 125 and a drain diffusion region 127 are formed respectively in the first ion implantation region 121 and the second ion implantation region 123. A channel diffusion region 130 is formed in the substrate 110 and located between the first ion implantation region 121 and the second ion implantation region 123. A gate layer 140 is disposed above the channel diffusion region 130 and located between the source diffusion region 125 and the drain diffusion region 127, wherein the gate layer 140 extends in a first direction D1.

Next, as shown in FIG. 5A, an ion implantation region 160 of the first conductivity type is optionally formed within the gate layer 140. In an embodiment, the gate layer 140 is doped with dopants of the first conductivity type (e.g. N type dopants) for forming the ion implantation region 160 within the gate layer 140. In an embodiment, the gate layer 140 is fully doped with the dopants of the first conductivity type, such that the gate layer 140 forms a first type conductivity-doped gate layer. In other words, at this stage, the whole gate layer 140 is the ion implantation region 160.

Next, as shown in FIGS. 1A-1B and 5B, a third ion implantation region 150 of a second conductivity type is formed in the gate layer 140. In an embodiment, the gate layer 140 is doped with dopants of the second conductivity type (e.g. P type dopants) for forming the third ion implantation region 150 within the gate layer 140. The third ion implantation region 150 is located above and covers two side portions 131 of the channel diffusion region 130, the two side portions 131 are adjacent to two edges 130e of the channel diffusion region 130, and the two edges 130e extend in a second direction D2 perpendicular to the first direction D1. As such the semiconductor structure 10 as shown in FIGS. 1A-1B is formed.

Likewise, the semiconductor structures 20, 30, and 40 may be formed according to processes similar to the above process for forming the semiconductor structure 10 by varying the extending range of the third ion implantation region 150 formed within the gate layer 140.

Figure 6:
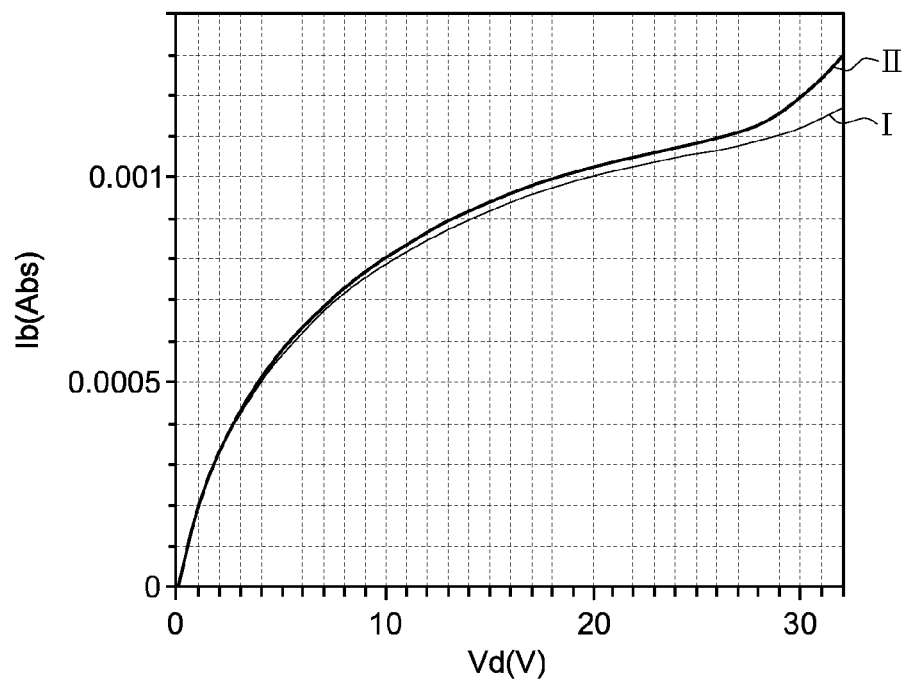
FIG. 6 shows Id-Vd curves according to a comparative embodiment and an embodiment of the present disclosure.
Figure 7:
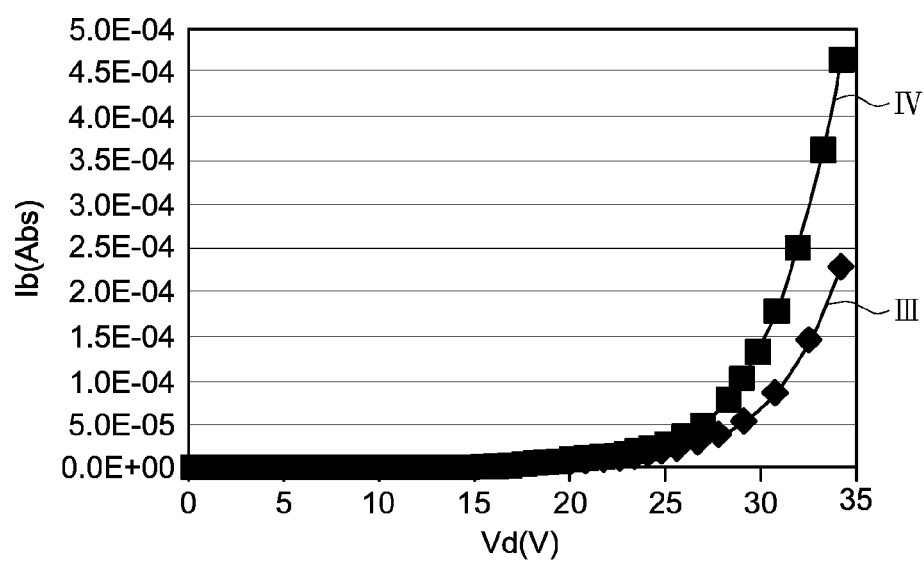
FIG. 7 shows Ib-Vd curves according to a comparative embodiment and an embodiment of the present disclosure.

FIG. 6 shows Id-Vd curves according to a comparative embodiment and an embodiment of the present disclosure, and FIG. 7 shows Ib-Vd curves according to a comparative embodiment and an embodiment of the present disclosure. As shown in FIGS. 6-7, curves I and III represent the Id-Vd curve and the Ib-Vd curve respectively of a semiconductor structure of an embodiment of the present disclosure, and curves II and IV represent the Id-Vd curve and the Ib-Vd curve respectively of a semiconductor structure of a comparative embodiment. The results as shown in FIGS. 6-7 are simulation results by TOAD. The major difference between the structures of the embodiment and the comparative embodiment is in that the structure of the comparative embodiment lacks the third ion implantation region 150 formed within the gate layer 140.

In FIG. 6, the curve II shows an obvious increase of the drain current (Id) when the drain voltage (Vd) is raised to beyond about 26V, while the curve I does not have such increase. The increase in the drain current (Id) indicates that current flows to bulk, which is an indication of kirk effect. In addition, as represented in FIG. 6, the bulk current (Ib) of the semiconductor structure of the embodiment, as shown in the curve III, is largely reduced compared to that of the semiconductor structure of the comparative embodiment, as shown in the curve IV. To be more specific, FIG. 7 shows that the bulk current (Ib) is reduced from 4.6e-4 (curve IV, comparative embodiment) to 2.2e-4 (curve III, embodiment), which shows an about 52% of reduction of the bulk current. Such reduction of the bulk current is advantageous to the minimization of kirk effect as well as decrease of device's failure ratio.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a substrate;
    a first ion implantation region of a first conductivity type and a second ion implantation region of the first conductivity type formed in the substrate;
    a source diffusion region and a drain diffusion region formed in the first ion implantation region and the second ion implantation region respectively;
    a channel diffusion region formed in the substrate and located between the first ion implantation region and the second ion implantation region;
    a gate layer disposed above the channel diffusion region and located between the source diffusion region and the drain diffusion region, wherein the gate layer extends in a first direction; and
    a third ion implantation region of a second conductivity type formed in the gate layer, wherein the third ion implantation region is located above and covers two side portions of the channel diffusion region, the two side portions are adjacent to two edges of the channel diffusion region, and the two edges extend in a second direction perpendicular to the first direction;
    wherein the third ion implantation region has a first width along the second direction, the two edges of the channel diffusion region have an edge length along the second direction, the first width of the third ion implantation region is equal to the edge length of the two edges of the channel diffusion region, and the third ion implantation region extends along the first direction and stops at the two edges of the channel diffusion region.

2. The semiconductor structure according to claim 1, wherein the third ion implantation region extends along the first direction towards a region between the source diffusion region and the drain diffusion region by an extending distance, the source diffusion region has a source length, and a ratio of the extending distance to the source length is ⅙ to ⅓.

3. The semiconductor structure according to claim 1, further comprising:
    a fourth ion implantation region of the first conductivity type formed in the gate layer, wherein the fourth ion implantation region is located above and covers a center portion of the channel diffusion region.

4. The semiconductor structure according to claim 1, further comprising:
    an isolation structure located adjacent to the edges of the channel diffusion region; and
    a gate oxide formed on the channel diffusion region and the isolation structure, wherein a thickness of the gate oxide above the channel diffusion region is larger than a thickness of the gate oxide above the isolation structure, and the third ion implantation region covers a portion of the gate oxide above the isolation structure.

5. The semiconductor structure according to claim 1, further comprising:
    an isolation structure located adjacent to the edges of the channel diffusion region; and
    an isolation ion implantation region of the second conductivity type, wherein the isolation structure is disposed between the channel diffusion region and the isolation ion implantation region, and the third ion implantation region is separated from the isolation ion implantation region.

6. The semiconductor structure according to claim 1, wherein the first conductivity type is N type, and the second conductivity type is P type.

7. A manufacturing method of a semiconductor structure, comprising:
    providing a substrate;
    forming a first ion implantation region of a first conductivity type and a second ion implantation region of the first conductivity type in the substrate;
    forming a source diffusion region and a drain diffusion region in the first ion implantation region and the second ion implantation region respectively;
    forming a channel diffusion region in the substrate and located between the first ion implantation region and the second ion implantation region;
    forming a gate layer disposed above the channel diffusion region and located between the source diffusion region and the drain diffusion region, wherein the gate layer extends in a first direction; and
    forming a third ion implantation region of a second conductivity type in the gate layer, wherein the third ion implantation region is located above and covers two side portions of the channel diffusion region, the two side portions are adjacent to two edges of the channel diffusion region, and the two edges extend in a second direction perpendicular to the first direction;
    wherein the third ion implantation region has a first width along the second direction, the two edges of the channel diffusion region have an edge length along the second direction, the first width of the third ion implantation region is equal to the edge length of the two edges of the channel diffusion region, and the third ion implantation region extends along the first direction and stops at the two edges of the channel diffusion region.

8. The manufacturing method of the semiconductor structure according to claim 7, wherein the third ion implantation region extends along the first direction towards a region between the source diffusion region and the drain diffusion region by an extending distance, the source diffusion region has a source length, and a ratio of the extending distance to the source length is ⅙ to ⅓.

9. The manufacturing method of the semiconductor structure according to claim 7, further comprising:
forming a fourth ion implantation region of the first conductivity type in the gate layer, wherein the fourth ion implantation region is located above and covers a center portion of the channel diffusion region.

10. The manufacturing method of the semiconductor structure according to claim 7, further comprising:
forming an isolation structure located adjacent to the edges of the channel diffusion region; and
forming a gate oxide on the channel diffusion region and the isolation structure, wherein a thickness of the gate oxide above the channel diffusion region is larger than a thickness of the gate oxide above the isolation structure, and the third ion implantation region covers a portion of the gate oxide above the isolation structure.

11. The manufacturing method of the semiconductor structure according to claim 7, further comprising:
forming an isolation structure located adjacent to the edges of the channel diffusion region; and
forming an isolation ion implantation region of the second conductivity type, wherein the isolation structure is disposed between the channel diffusion region and the isolation ion implantation region, and the third ion implantation region is separated from the isolation ion implantation region.

12. The manufacturing method of the semiconductor structure according to claim 7, wherein the first conductivity type is N type, and the second conductivity type is P type.

* * * * *